(12) United States Patent
Kuit et al.

(10) Patent No.: US 7,349,067 B2
(45) Date of Patent: Mar. 25, 2008

(54) LITHOGRAPHIC APPARATUS AND DEVICE MANUFACTURING METHOD

(75) Inventors: Jan Jaap Kuit, Veldhoven (NL); Petrus Rutgerus Bartray, Ysselsteyn (NL); Dirk Jan Bijvoet, Eindhoven (NL); Jan Frederik Hoogkamp, Breda (NL)

(73) Assignee: ASML Netherlands B.V., Veldhoven (NL)

( * ) Notice: Subject to any disclaimer, the term of this patent is extended or adjusted under 35 U.S.C. 154(b) by 8 days.

(21) Appl. No.: 10/892,394

(22) Filed: Jul. 16, 2004

(65) Prior Publication Data

US 2005/0280798 A1 Dec. 22, 2005

Related U.S. Application Data

(63) Continuation-in-part of application No. 10/871,528, filed on Jun. 21, 2004.

(51) Int. Cl.
G03B 27/42 (2006.01)
G03B 27/58 (2006.01)

(52) U.S. Cl. .......................... 355/53; 355/72; 355/75; 414/940

(58) Field of Classification Search .................. 355/53, 355/72, 75; 378/34; 414/935–941
See application file for complete search history.

(56) References Cited

U.S. PATENT DOCUMENTS

| | | | | |
|---|---|---|---|---|
| 5,217,501 A * | 6/1993 | Fuse et al. | ................. | 29/25.01 |
| 5,578,127 A * | 11/1996 | Kimura | ....................... | 118/695 |
| 5,825,470 A * | 10/1998 | Miyai et al. | ................... | 355/72 |
| 5,844,662 A * | 12/1998 | Akimoto et al. | .............. | 355/27 |
| 6,309,116 B1 * | 10/2001 | Mahara et al. | .............. | 396/611 |
| 6,377,329 B1 * | 4/2002 | Takekuma | .................... | 355/27 |
| 6,404,483 B1 * | 6/2002 | Segers et al. | ................. | 355/53 |
| 6,515,731 B1 * | 2/2003 | Akimoto | ....................... | 355/27 |
| 6,707,528 B1 * | 3/2004 | Aoyama et al. | .............. | 355/18 |
| 2002/0071105 A1 * | 6/2002 | Miwa | .......................... | 355/53 |
| 2002/0077053 A1 * | 6/2002 | Pham | ......................... | 451/526 |
| 2002/0081175 A1 * | 6/2002 | Kawahara et al. | .......... | 414/217 |
| 2003/0121535 A1 * | 7/2003 | Biberger et al. | ........... | 134/25.4 |
| 2003/0165755 A1 * | 9/2003 | Mui et al. | ..................... | 430/30 |
| 2004/0263823 A1 * | 12/2004 | Klomp et al. | ................. | 355/75 |

* cited by examiner

*Primary Examiner*—D. Rutledge
(74) *Attorney, Agent, or Firm*—Pillsbury Winthrop Shaw Pittman LLP

(57) ABSTRACT

A lithographic apparatus having an improved transfer unit, is presented. The lithographic apparatus includes a processing unit that performs a lithographic process involving exchangeable objects in which the processing unit includes an illumination system that provides a beam of radiation, a support structure configured to support a patterning device that imparts a desired pattern to the beam of radiation, a substrate holder configured to hold a substrate, and a projection system configured to project the patterned beam onto a target portion of the substrate. The lithographic apparatus also includes a transfer unit comprising a single robot. The single robot is configured to transfer a first exchangeable object from a loading station to the processing unit and to transfer a second exchangeable object from the processing unit to a discharge station.

15 Claims, 8 Drawing Sheets

LITHOGRAPHIC APPARATUS AND DEVICE MANUFACTURING METHOD

This is a continuation-in-part of U.S. patent application Ser. No. 10/871,528 filed Jun. 21, 2004.

BACKGROUND OF THE INVENTION

1. Field of the Invention

The present invention relates to a lithographic apparatus and an associated device manufacturing method.

2. Description of the Related Art

Lithographic apparatus can be used, for example, in the manufacture of integrated circuits (ICs). In such a case, a patterning device may be used to generate a desired circuit pattern corresponding to an individual layer of the IC, and this pattern can be imaged onto a target portion (e.g. comprising one or more dies) on a substrate (silicon wafer) that has been coated with a layer of radiation-sensitive material (resist).

In general, a single substrate will contain a network of adjacent target portions that are successively exposed. Known lithographic apparatus include so-called steppers, in which each target portion is irradiated by exposing an entire pattern onto the target portion in one go, and so-called scanners, in which each target portion is irradiated by scanning the pattern through the projection beam in a given direction (the "scanning"-direction) while synchronously scanning the substrate parallel or anti-parallel to this direction.

The processing of substrates requires that the substrates, destined for processing, are supplied to the lithographic apparatus and, after processing, the processed substrates are removed from the apparatus. Generally, a track brings the substrates, which are to be processed to a loading station. From this loading station, the substrates are moved one-by-one to the processing unit of a lithographic apparatus, in which the actual processing of the substrate takes place.

Processed substrates are then generally moved, one-by-one, from the processing unit of the lithographic apparatus to a discharge station. A track generally takes the processed substrates away from the discharge station.

Other ways of supplying the substrates to the lithographic apparatus and removing substrates from the lithographic apparatus are known to the person skilled in the art, such as, for example, the use of a front opening unified pod. The front opening unified pod contains a plurality of substrates, and supplies them one-by-one to the loading station.

In known lithographic apparatus, a transfer unit for transferring a substrate, which is to be processed, from a loading station to the processing unit and for transferring the processed substrate from the processing unit to a discharge station is provided. The known transfer unit comprises a loading robot and a discharge robot. The loading robot takes a substrate, which is to be processed, from the loading station to the processing unit of the lithographic apparatus. The discharge robot then takes the processed substrate from the processing unit of the lithographic apparatus to the discharge station.

This known transfer unit setup is quite expensive, and requires a relatively large amount of space.

SUMMARY OF THE INVENTION

The principles of the present invention, as embodied and broadly described herein, provide for a lithographic apparatus having a transfer unit that is less expensive and relatively smaller than the known transfer unit. In one embodiment, the lithographic apparatus comprises a processing unit configured to perform a lithographic process involving exchangeable objects, the processing unit comprising an illumination system that provides a beam of radiation, a support structure configured to support a patterning device that imparts a desired pattern to the beam of radiation, a substrate holder configured to hold a substrate, and a projection system configured to project the patterned beam onto a target portion of the substrate. The lithographic apparatus also includes a transfer unit comprising a single robot. The single robot is configured to transfer a first exchangeable object from a loading station to the processing unit and to transfer a second exchangeable object from the processing unit to a discharge station.

The exchangeable object can be a substrate, but also an other type of object that needs to be exchanged every once in a while. By using only one robot instead of the conventional two robots, the transfer unit becomes cheaper and requires less space.

Preferably, the robot comprises a first object handler for transferring the first exchangeable object from the loading station to the processing unit and a second object handler for transferring the second exchangeable object from the processing unit to the discharge station.

This configuration of the robot allows an effective and relatively simple design.

In one embodiment, the first object handler is coupled to a first arm and the second object handler is coupled to a second arm, the first arm and the second arm being rotatable around an axis of rotation. In this embodiment, the rotational movement of the arms is used to transfer exchangeable objects.

Advantageously, at least one of the first arm and the second arm is moveable in a direction which is at least substantially parallel to the axis of rotation. The introduction of this extra degree of freedom in the handling of the exchangeable objects provides enhanced flexibility with respect to the movements of the exchangeable objects.

Also, the position of the axis of rotation may be fixed relative to the processing unit. This results in a very simple and robust design of the robot, since only the rotation of the arms has to be controlled.

Moreover, the first arm and the second arm may be fixed relative to each other in such a manner that they enclose a constant angle between them. This simplifies the design of the robot even more, since only one rotational movement has to be controlled.

In known lithographic apparatus, usually an interferometer unit is located close to substrate table that receives the substrate from the transfer unit. Preferably, when the robot is used to transfer substrates in the area of the substrate table and the interferometer unit, the shape of the arms is adapted so that they can pass the interferometer. A general z-shape of the longitudinal section is found to be suitable for the shape of the arms.

In another embodiment, the first object handler and the second object handler are coupled to a common robot arm which is adapted to move the first object handler and the second object handler relative to the processing unit.

Advantageously, at least one object handler is coupled to a wrist assembly which wrist assembly allows the object handler coupled thereto to rotate relative to the robot arm.

Moreover, in this embodiment the first object handler and the second object handler are both coupled to the wrist assembly. Advantageously, the first object handler and the second object handler are fixed relative to each other in such a manner that they enclose a constant angle between them.

Furthermore, the transfer unit comprises docking mechanism which are adapted to co-operate with a part of the processing unit that is adapted to carry the exchangeable object for positioning at least one object handler relative to the processing unit. This allows a reliable and accurate positioning of the exchangeable object relative to the processing unit.

An alternative measure for allowing reliable and accurate positioning of the exchangeable object relative to the processing unit is to provide a combination of wrist assembly and object handlers, which combination is detachable from the robot arm when at least one object handler is positioned relative to the processing unit. This measure can also be combined with the docking mechanism as described in the previous paragraph.

According to a further embodiment, there is provided a device manufacturing method comprising providing a substrate that is at least partially covered by a layer of radiation-sensitive material, providing a beam of radiation via an illumination system, configuring the beam of radiation with a desired pattern in its cross-section based on a patterning device, projecting the patterned beam of radiation onto a target portion of the substrate and transferring a first exchangeable object from a loading station to the processing unit and transferring a second exchangeable object from the processing unit to a discharge station via a single robot.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively.

The substrate referred to herein may be processed, before or after exposure, in for example a track (a tool that typically applies a layer of resist to a substrate and develops the exposed resist) or a metrology or inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The terms "radiation" and "beam" used herein encompass all types of electromagnetic radiation, including ultraviolet (UV) radiation (e.g. having a wavelength of 365, 248, 193, 157 or 126 nm) and extreme ultra-violet (EUV) radiation (e.g. having a wavelength in the range of 5-20 nm), as well as particle beams, such as ion beams or electron beams.

The term "patterning device" used herein should be broadly interpreted as referring to a device that can be used to impart a projection beam with a pattern in its cross-section such as to create a pattern in a target portion of the substrate. It should be noted that the pattern imparted to the projection beam may not exactly correspond to the desired pattern in the target portion of the substrate. Generally, the pattern imparted to the projection beam will correspond to a particular functional layer in a device being created in the target portion, such as an integrated circuit.

The patterning device may be transmissive or reflective. Examples of patterning means include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions; in this manner, the reflected beam is patterned.

The support structure supports, i.e. bears the weight of, the patterning device. It holds the patterning device in a way depending on the orientation of the patterning means, the design of the lithographic apparatus, and other conditions, such as for example whether or not the patterning means is held in a vacuum environment. The support can be using mechanical clamping, vacuum, or other clamping techniques, for example electrostatic clamping under vacuum conditions. The support structure may be a frame or a table, for example, which may be fixed or movable as required and which may ensure that the patterning device is at a desired position, for example with respect to the projection system. Any use of the terms "reticle" or "mask" herein may be considered synonymous with the more general term "patterning device".

The term "projection system" used herein should be broadly interpreted as encompassing various types of projection system, including refractive optical systems, reflective optical systems, and catadioptric optical systems, as appropriate for example for the exposure radiation being used, or for other factors such as the use of an immersion fluid or the use of a vacuum. Any use of the term "lens" herein may be considered as synonymous with the more general term "projection system".

The illumination system may also encompass various types of optical components, including refractive, reflective, and catadioptric optical components for directing, shaping, or controlling the projection beam of radiation, and such components may also be referred to below, collectively or singularly, as a "lens".

The lithographic apparatus may be of a type having two (dual stage) or more substrate tables (and/or two or more mask tables). In such "multiple stage" machines the additional tables may be used in parallel, or preparatory steps may be carried out on one or more tables while one or more other tables are being used for exposure.

The lithographic apparatus may also be of a type wherein the substrate is immersed in a liquid having a relatively high refractive index, e.g. water, so as to fill a space between the final element of the projection system and the substrate. Immersion liquids may also be applied to other spaces in the lithographic apparatus, for example, between the mask and the first element of the projection system. Immersion techniques are well known in the art for increasing the numerical aperture of projection systems.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION OF THE INVENTION

Although embodiments of the transfer unit of the present invention will be described within the context of a lithographic apparatus for clarity, it will be appreciated that the transfer unit, as disclosed, may be equally applied to other technologies and/or systems. It will also be appreciated that the transfer unit may be employed for exchangeable objects other than the disclosed substrate.

Figure 1:
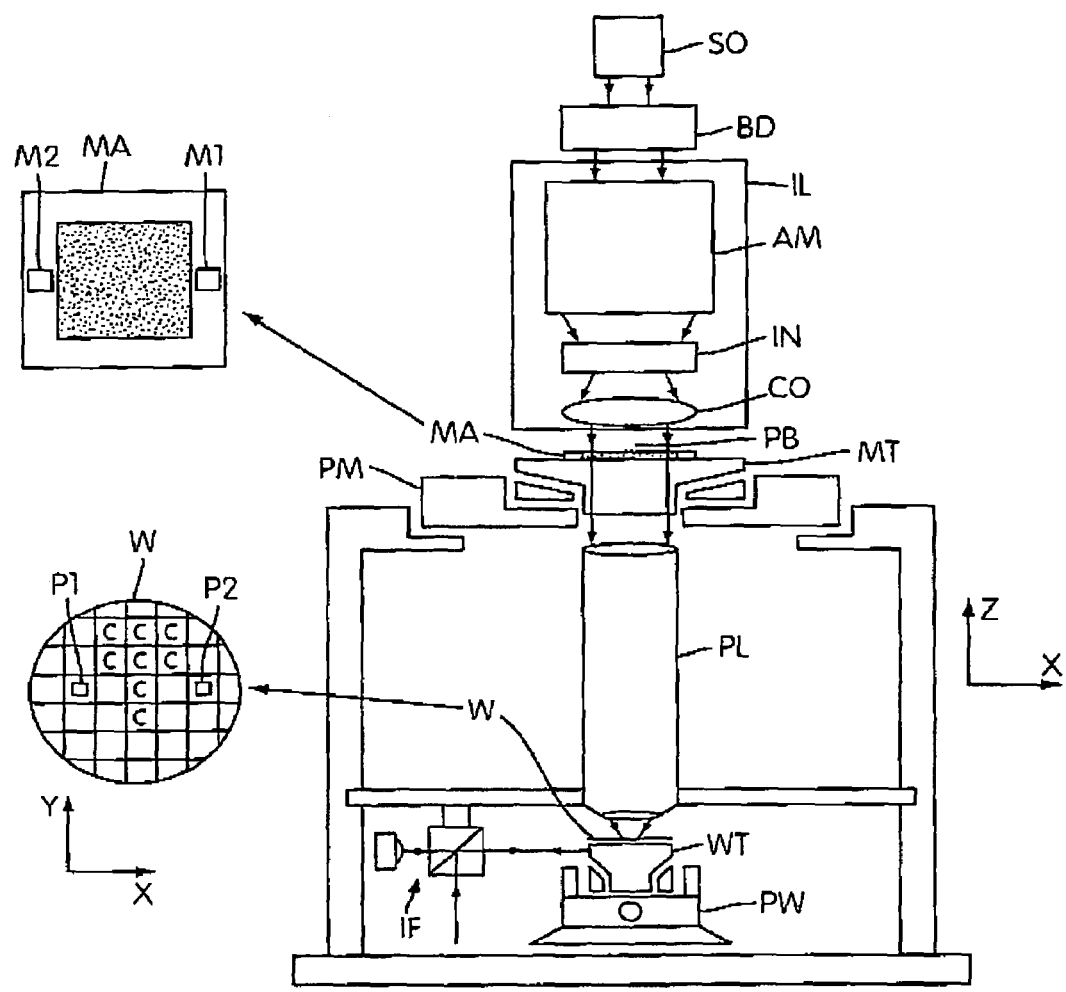
FIG. 1 depicts a lithographic apparatus according to an embodiment of the invention.

FIG. 1 schematically depicts a lithographic apparatus according to a particular embodiment of the invention. The apparatus comprises:

an illumination system (illuminator) IL: for providing a projection beam PB of radiation (e.g. UV or EUV radiation).

a first support structure (e.g. a mask table/holder) MT: for supporting patterning device (e.g. a mask) MA and coupled to first positioning mechanism PM for accurately positioning the patterning device with respect to item PL;

a substrate table (e.g. a wafer table/holder) WT: for holding a substrate (e.g. a resist-coated wafer) W and coupled to second positioning mechanism PW for accurately positioning the substrate with respect to item PL; and a projection system (e.g. a reflective projection lens) PL: for imaging a pattern imparted to the projection beam PB by patterning device MA onto a target portion C (e.g. comprising one or more dies) of the substrate W.

As here depicted, the apparatus is of a transmissive type (e.g. employing a transmissive mask). Alternatively, the apparatus may be of a reflective type (e.g. or a programmable mirror array of a type as referred to above).

The illuminator IL receives a beam of radiation from a radiation source SO. The source and the lithographic apparatus may be separate entities, for example when the source is a plasma discharge source. In such cases, the source is not considered to form part of the lithographic apparatus and the radiation beam is generally passed from the source SO to the illuminator IL with the aid of a radiation collector comprising for example suitable collecting mirrors and/or a spectral purity filter. In other cases the source may be integral part of the apparatus, for example when the source is a mercury lamp. The source SO and the illuminator IL, may be referred to as a radiation system.

The illuminator IL may comprise adjusting mechanism for adjusting the angular intensity distribution of the beam. Generally, at least the outer and/or inner radial extent (commonly referred to as σ-outer and σ-inner, respectively) of the intensity distribution in a pupil plane of the illuminator can be adjusted. The illuminator provides a conditioned beam of radiation, referred to as the projection beam PB, having a desired uniformity and intensity distribution in its cross-section.

The projection beam PB is incident on the mask MA, which is held on the mask table MT. Being reflected by the mask MA, the projection beam PB passes through the lens PL, which focuses the beam onto a target portion C of the substrate W. With the aid of the second positioning mechanism PW and position sensor IF2 (e.g. an interferometric device), the substrate table WT can be moved accurately, e.g. so as to position different target portions C in the path of the beam PB. Similarly, the first positioning mechanism PM and position sensor IF1 can be used to accurately position the mask MA with respect to the path of the beam PB, e.g. after mechanical retrieval from a mask library, or during a scan. In general, movement of the object tables MT and WT will be realized with the aid of a long-stroke module and a short-stroke module, which form part of the positioning mechanism PM and PW. However, in the case of a stepper (as opposed to a scanner) the mask table MT may be coupled to a short stroke actuator only, or may be fixed. Mask MA and substrate W may be aligned using mask alignment marks M1, M2 and substrate alignment marks P1, P2.

The depicted apparatus can be used in the following preferred modes:

step mode: the mask table MT and the substrate table WT are kept essentially stationary, while an entire pattern imparted to the projection beam is projected onto a target portion C in one go (i.e. a single static exposure). The substrate table WT is then shifted in the X and/or Y direction so that a different target portion C can be exposed. In step mode, the maximum size of the exposure field limits the size of the target portion C imaged in a single static exposure.

scan mode: the mask table MT and the substrate table WT are scanned synchronously while a pattern imparted to the projection beam is projected onto a target portion C (i.e. a single dynamic exposure). The velocity and direction of the substrate table WT relative to the mask table MT is determined by the (de-)magnification and image reversal characteristics of the projection system PL. In scan mode, the maximum size of the exposure field limits the width (in the non-scanning direction) of the target portion in a single dynamic exposure, whereas the length of the scanning motion determines the height (in the scanning direction) of the target portion.

other mode: the mask table MT is kept essentially stationary holding a programmable patterning device, and the substrate table WT is moved or scanned while a pattern imparted to the projection beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
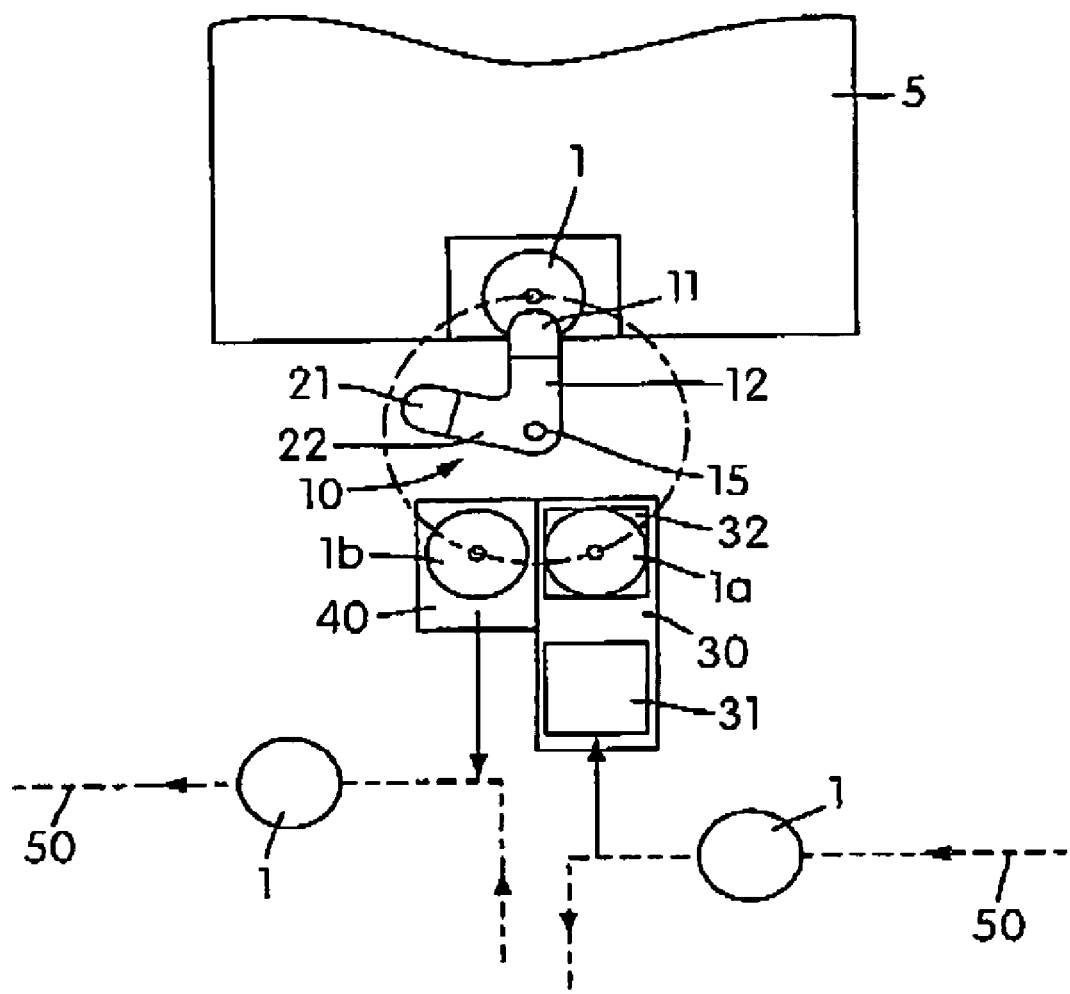
FIG. 2 schematically shows a first embodiment of the invention.

FIG. 2 illustrates one embodiment of the present invention, in which a processing unit 5 of a lithographic apparatus is provided for processing substrates 1. The substrates 1 to be processed are supplied to the processing unit 5 by means of a transfer unit comprising a robot 10. In accordance with a feature of the present invention, the same robot 10 also takes processed substrates 1 away from the processing unit 5.

A track 50 transports the substrates 1 to be processed to the lithographic apparatus and transports the processed substrates 1 away from the lithographic apparatus, for example, to an etching device (not shown). The track 50 delivers the substrates 1, one-by-one, to a loading station 30, which comprises a receiving unit 31 and a loading unit 32. The receiving unit 31 can receive one of the substrates 1 from the track 50, while the loading unit 32 can load one of the substrates 1 to the robot 10.

The loading station 30 can act as a buffer for the supply of substrates 1 to the processing unit 5. This is particularly advantageous since the substrates 1 generally are delivered by the track 50 at irregular time intervals. By using the loading station 30 as a buffer the chance of a stand still of the processing unit 5 in case of an irregular delivery of substrates 1 by the track 50 is reduced with respect to a system without such a buffer.

Preferably, the loading station 30 is provided with means to prepare substrates 1 for processing. For example, a pre-alignment unit can be provided for determining respective dimensions of the respective substrates 1 or the position of respective substrates 1. Measuring dimensions and/or the position provides information that can be used for accurate positioning of the respective substrate relative to an object handler of the robot 10 and/or to the processing unit 5.

The means for preparing a substrate 1 for processing can also comprise a temperature stabilizing unit (TSU), which brings a substrate 1 to a predetermined temperature. The temperature sensitive processes in the processing unit 5 preferably has a predetermined temperature of the substrate 1. By using a temperature stabilization unit, the substrate 1 can already be brought at or at least close to this predetermined temperature.

Preferably, preparing the substrate 1 for processing as described above takes place during the buffering of the substrate 1. This saves valuable processing time in the processing unit 5.

A transfer unit is provided to take the substrates 1 one-by-one away from the loading station 30 to the processing unit 5, and to take processed substrates 1 away from the processing unit 5 to a discharge station 40. This transfer process is illustrated in FIG. 3.

Figure 4:
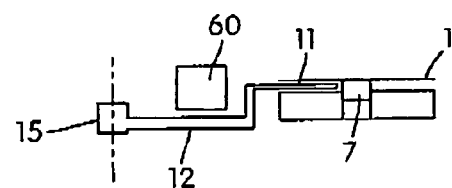
FIG. 4 schematically shows an elevational view of the embodiment of FIG. 2.

The transfer unit has a single robot 10, which is provided with a first object handler 11 (FIG. 4). The first object handler 11 engages a first substrate 1a at the loading station 30.

Preferably, in the loading unit 32, the relevant substrate 1 is supported by one or more pins 7, which are adapted to move the first substrate 1a in a direction which is substantially perpendicular to a plane defined by a lithographic pattern present on the relevant substrate 1.

Figures 3A, 3B, 3C:
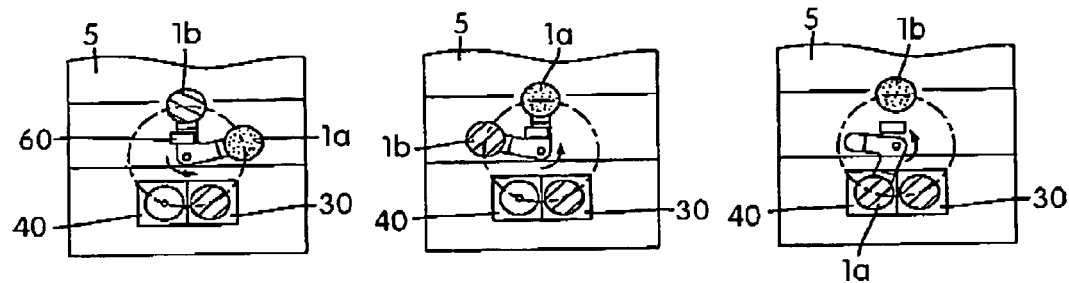
FIG. 3 schematically shows the process of supplying and discharging substrates using the embodiment of FIG. 2.
Figures 3D, 3E:
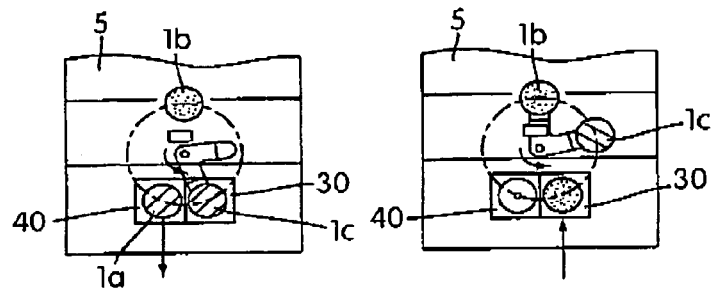

In one embodiment, the pins 7 lift the first substrate 1a when the first object handler 11 approaches (FIG. 3D). The first object handler 11 is then positioned below the first substrate 1a. The pins 7 then lower the first substrate 1a so that the first substrate 1a comes to lie upon the first object handler 11.

The robot 10 of the transfer unit also comprises a second object handler 21. When a first substrate 1a is loaded onto the first object handler 11, the second object handler 21 is empty (FIG. 3D).

The robot 10 then moves the second object handler 21 to the processing unit 5. The processing unit 5 provides a second substrate 1b, which has been processed by the processing unit 5 (FIG. 3E). The second object handler 21 takes over the second substrate 1b (FIG. 3A). Advantageously, also the processing unit 5 is provided with pins 7 which are adapted to move the second substrate 1b in a direction which is substantially perpendicular to the plane containing the pattern of the substrate 1. In one embodiment, the pins 7 lift the second substrate 1b before the second object handler 21 approaches. After the lifting of the substrate 1b by the pins 7, the second object handler 21 is positioned below the second substrate 1b. The pins 7 then lower the second substrate 1b so that the second substrate 1b comes to lie upon the second object handler 21.

The robot 10 then moves the second substrate 1b away from the processing unit 5 and moves the first substrate 1a towards the processing unit 5 (FIG. 3B). After positioning the first substrate 1a relative to the processing unit 5, the first substrate 1a is loaded to the processing unit 5.

Then, the robot 10 moves the second substrate 1b to discharge station 40. Now, the first object handler 11 is empty (FIG. 3C). At the discharge station 40, the second substrate 1b is removed from the second object handler 21, and delivered to the track 50. Just like the loading station 30, the discharge station 40 can act as a buffer, if required. For removing the second substrate 1b from the second object handler 21, pins 7 like described before can be used: the second object handler 21 positions the second substrate 1b above the pins 7, the pins 7 rise and lift the substrate 1 off the second object handler 21, and the second object handler 21 is moved away (FIG. 3E).

When the second substrate 1b is removed from the second object handler 21, the first object handler 11 is moved to the loading station 30 to collect a third substrate 1c.

As an alternative, the object handlers 11, 21 can be moveable in a direction substantially perpendicular to the axis of rotation. Herewith, the object handlers may be lowered to engage the underside of the substrate 1.

In the embodiment of FIG. 2, the object handlers engage the underside of the substrate 1. It is, however, also possible that the object handlers engage the substrate 1 in an other way, such as by the edge of the substrate 1 or by means of a suction cup engaging on the top of the substrate 1.

Also, in the embodiment of FIG. 2, the robot 10 comprises a first arm 12 and a second arm 22. The first object handler 11 is coupled to the first arm 12 and the second object handler 21 is coupled to the second arm 22. Both arms 12,22 are rotatable around hub 15. In the example of FIG. 2, the hub 15 is arranged such that it provides an axis of rotation 15a oriented substantially perpendicularly to the plane of a substrate 1 which is present on one of the object handlers.

Moreover, in the example of FIG. 2, the first arm 12 and the second arm 22 are fixed relative to each other in such a manner that they enclose a constant angle between them, as seen in the direction parallel to the axis of rotation 15a. It is, however, also possible that the arms 12,22 can rotate independently of each other. In that case, their rotations can be in the same direction, or in opposite directions.

Furthermore, in the example of FIG. 2, the position of the axis of rotation 15a is fixed relative to the processing unit 5. Fixing the arms 12,22 at a constant relative angle and fixing the position of the axis of rotation 15a relative to the processing unit 5 reduces the degrees of freedom of the robot 10 as a whole. This reduction in degrees of freedom leads to a simple design of the robot 10 with just a few moving parts, and also the control system for actuating the robot 10 can be kept very simple. Also, as is clear from FIG. 3, in the embodiment according to the example of FIG. 2 the transfer of a first substrate 1a from the loading station 30 to the processing unit 5 and the transfer of a second substrate 1b from the processing unit 5 to the discharge unit takes place substantially within a single revolution of the first arm 12 and the second arm 22 around the axis of rotation 15a.

On the other hand, more degrees of freedom may be desired. This can be realized in various ways. Both arms 12,22, or at least one of them can be made moveable in a direction that is substantially parallel to the axis of rotation 15a. Also, the hub 15 can be made moveable relative to the processing unit 5, and/or one or both arms 12,22 can be made extendable, so that their length can be varied.

FIG. 4 shows an elevational view of the embodiment of FIG. 2. In this example, the lithographic apparatus also comprises an interferometer 60 for determining the position of the substrate table. As can be seen in FIG. 3, the interferometer 60 is in the way of the arms 12,22 of the robot 10 as they perform their rotation. In order to avoid collision, the arms 12,22 are generally z-shaped with two horizontal parts at a different height and an intermediate part connecting the two horizontal parts, as is shown in FIG. 4. This way, the arms 12,22 can pass the interferometer 60 during the rotation of the arms 12,22. Such an adaptation of the shape of the arms as described above can also be used when other objects are in the way.

Figure 5:
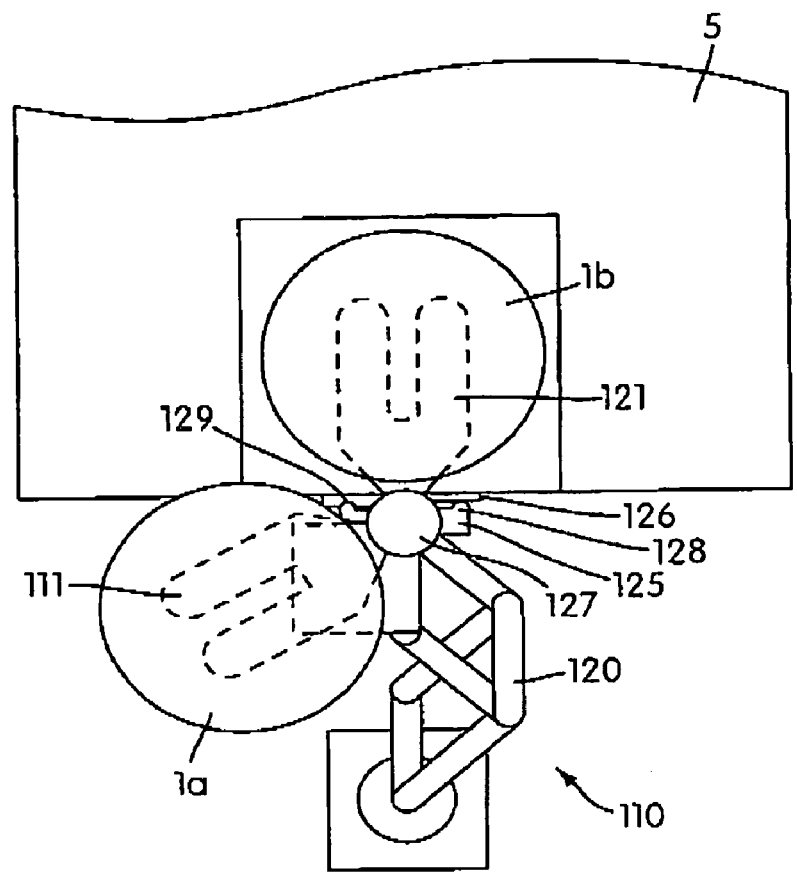
FIG. 5 schematically shows a second embodiment of the invention.
Figure 5:
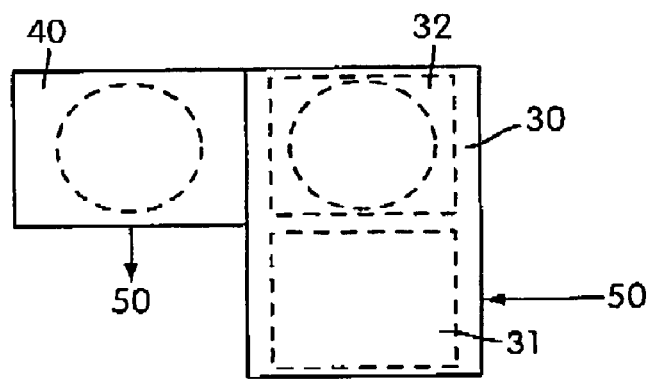
Figure 6A:
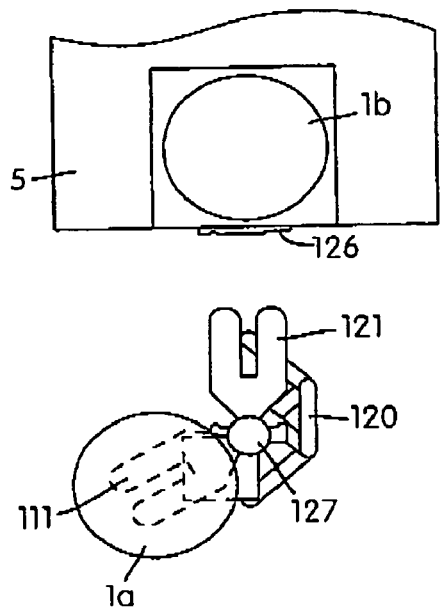
FIG. 6 schematically shows the process of supplying and discharging substrates using the embodiment of FIG. 5.
Figure 6B:
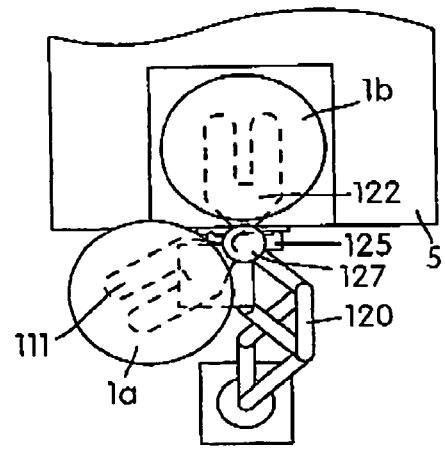
Figure 6C:
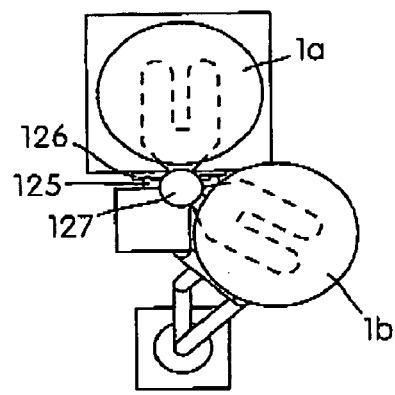
Figure 6D:
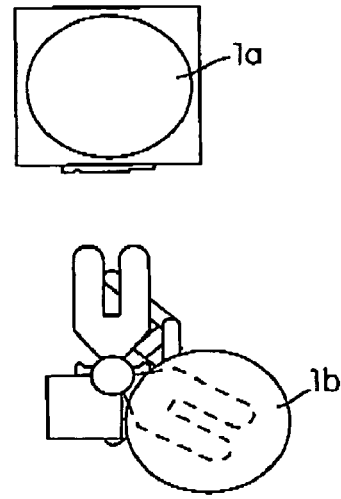

FIG. 5 depicts a second embodiment of the present invention. In this embodiment a processing unit 5 is also provided for processing substrates 1. The substrates 1 to be processed are supplied to the processing unit 5 by means of a transfer unit comprising a robot 110. The same robot 110 also takes processed substrates 1 away from the processing unit 5.

A track 50 transports substrates 1 which are to be processed to the lithographic apparatus and transports processed substrates 1 away from the lithographic apparatus, for example to an etching device.

The track 50 delivers the substrates 1 one-by-one to a loading station 30, which comprises a receiving unit 31 and a loading unit 32. The receiving unit 31 receives a substrate 1 from the track 50, while the loading unit 32 loads a substrate 1 to the robot 110. The loading station 30 can act as a buffer for the supply of substrates 1 to the processing unit 5. This is particularly advantageous since the substrates 1 generally are delivered by the track 50 at irregular time intervals. By using the loading station 30 as a buffer, the occurrence of a stand still of the processing unit in case of an irregular delivery of substrate by the track is reduced compared with a system lacking such a buffer.

Preferably, the loading station 30 is provided with means to prepare a substrate 1 for processing, as described above with respect to the embodiment of FIG. 2.

A transfer unit is provided to take the substrates 1 one-by-one away from the loading station 30 to the processing unit 5, and to take processed substrates 1 away from the processing unit 5 to a discharge station 40. This transfer process is illustrated in FIG. 6. The transfer unit has a single robot 110, which is provided with a first object handler 111. The first object handler 111 engages a first substrate 1a at the loading station 30.

The robot 110 of the transfer unit also comprises a second object handler 121. When a first substrate 1a is loaded onto the first object handler 111, the second object handler 121 is empty. The robot 110 then moves the second object handler 121 to the processing unit 5. The processing unit 5 provides a second substrate 1b, which has been processed by the processing unit 5. The second object handler 121 takes over the second substrate 1b.

The second object handler 121 then moves the second substrate 1b away from the processing unit 5 and moves the first substrate 1a towards the processing unit 5. After positioning the first substrate 1a relative to the processing unit 5, the first substrate 1a is loaded to the processing unit 5.

Then, the robot 110 moves the second substrate 1b to discharge station 40. Now, the first object handler 111 is empty. At the discharge station 40, the second substrate 1b is removed from the second object handler 121, and delivered to the track 50. Just like the loading station 30, the discharge station 40 can act as a buffer if this is required.

The object handlers 111, 121 can be similar to those of the embodiment of FIG. 2. Also, the way of loading and unloading the substrates 1 onto and from the object handlers can take place in a similar way.

In an alternative embodiment, which is not shown in the drawing, the first object handler 111 is arranged above the second object handler 121. The first object handler 111 occupies a fixed position relative to the wrist assembly 127. The second object handler 121 however is rotatable.

In this embodiment, the loading and discharging of substrates takes place as follows. The first object handler 111 collects a substrate 1a from the loading station 30. The robot 110 then moves the object handlers 111, 121 towards the processing unit 5. The second object handler 121 then engages a second substrate 1b which is to be discharged from the processing unit 5. Preferably, the second substrate 1b is lifted by means of pins 7 so that the second object handler 121 can engage the substrate 1b at the underside. When the substrate 1b is engaged by the second object handler 121, the pins 7 are retracted.

Then, the second object handler 121 is rotated by the wrist assembly 127 away from the processing unit 5. The robot 110 at this moment does not move the wrist assembly away from the processing unit 5. The first substrate 1a can now be loaded to the processing unit 5. Preferably, this is done by lifting the pins 7 again, this time to the extend that they lift the first substrate 1a off the first object handler 111.

Then, the robot 110 moves the object handlers 111, 121 away from the processing unit 5, and brings the second substrate 1b to the discharge station 40. The advantage of this embodiment is that the object handlers 111, 121 are positioned with respect to the processing unit 5 in a single action, so that they do not have to be positioned separately.

In the embodiment of FIG. 5, the object handlers 111, 121 are coupled to a common robot arm 120, which robot arm 120 is adapted to move the object handlers 111, 121 relative to the processing unit.

In the embodiment of FIG. 5, the object handlers are coupled to a wrist assembly 127, which wrist assembly is connectable to the robot arm 120. The wrist assembly 127 allows rotation of the object handlers 111, 121 relative to the robot arm 120. In the example of FIG. 5, the first object handler 111 and the second object handler are fixed relative to each other in such a manner that they enclose a constant angle. This way, the object handlers 111, 121 are rotated together.

In the embodiment of FIG. 5, the robot comprises docking mechanism 125. These docking mechanism 125 are adapted to cooperate with a counter element 126, which is provided on the processing unit 5. For a reliable exchange from a substrate 1 to and/or from the processing unit 5, it is important that the object handler 111, 121 which is to handle the specific substrate 1 and the processing unit 5 are positioned accurately with respect to one another.

This can be achieved by docking the robot 110 to the processing unit 5. The docking mechanism 125 provide a kinematic coupling between the wrist assembly 127 and the processing unit 5. This coupling can be realized by mechanical means, but also in a different way such as by eddy current damping. In the example of FIG. 5, a docking mechanism 125 is provided below the wrist assembly 127 of the robot 110. However, the docking mechanism 125 can also be arranged at a different position with respect to the wrist assembly 127.

In this example, the docking mechanism 125 is provided with at least one semispherical projection 128. However, also other numbers or shapes of the projections 128 are possible. This depends on for how many degrees of freedom movement of the wrist assembly 127 and the processing unit has to be coupled.

When the wrist assembly 127 approaches the processing unit 5, the docking mechanism 125 comes into engagement with the counter plate 126. The counter plate 126 is provided with at least one hole 129, which hole 129 corresponds to the projection 128 of the docking mechanism 125. The hole 129 and the projection 128 then "find" each other, and bring the wrist assembly 127 (which the object handlers 111, 121 coupled thereto) in a predetermined, accurate relative position with respect to the processing unit 5.

In this embodiment, it is advantageous that the wrist assembly 127 is somewhat flexibly coupled to the robot arm 120 with respect to the degrees of freedom related to the kinematic coupling, so that in can be brought into the predetermined position with respect to the processing unit 5 without becoming overly constrained. In practice, this means that in every degree of freedom in which the kinematic coupling between the wrist assembly 127 and the processing unit 5 is active, the wrist assembly 127 has to be moveable with respect to the robot arm.

This way of achieving a predetermined position between an object handler 111, 121, 11, 21 and the processing unit 5 can also be used in the embodiment of FIG. 2. In that case, a docking mechanism has to be provided on each arm 12, 22 or object handler 11, 21.

As described above, it is advantageous if the wrist assembly 127 is flexibly coupled to the robot arm 120 when docking mechanism are used to position the object handlers 111, 121 relative to the processing unit 5. However, it is also envisaged to disconnect the wrist assembly 127 (with the object handlers coupled thereto) from the robot arm 120 when the wrist assembly 127 is positioned relative to the processing unit 5. This way, the relative position of the object handler 111, 121 with respect to the processing unit is not disturbed by influences from the robot arm 120, such as vibrations.

Figure 7:
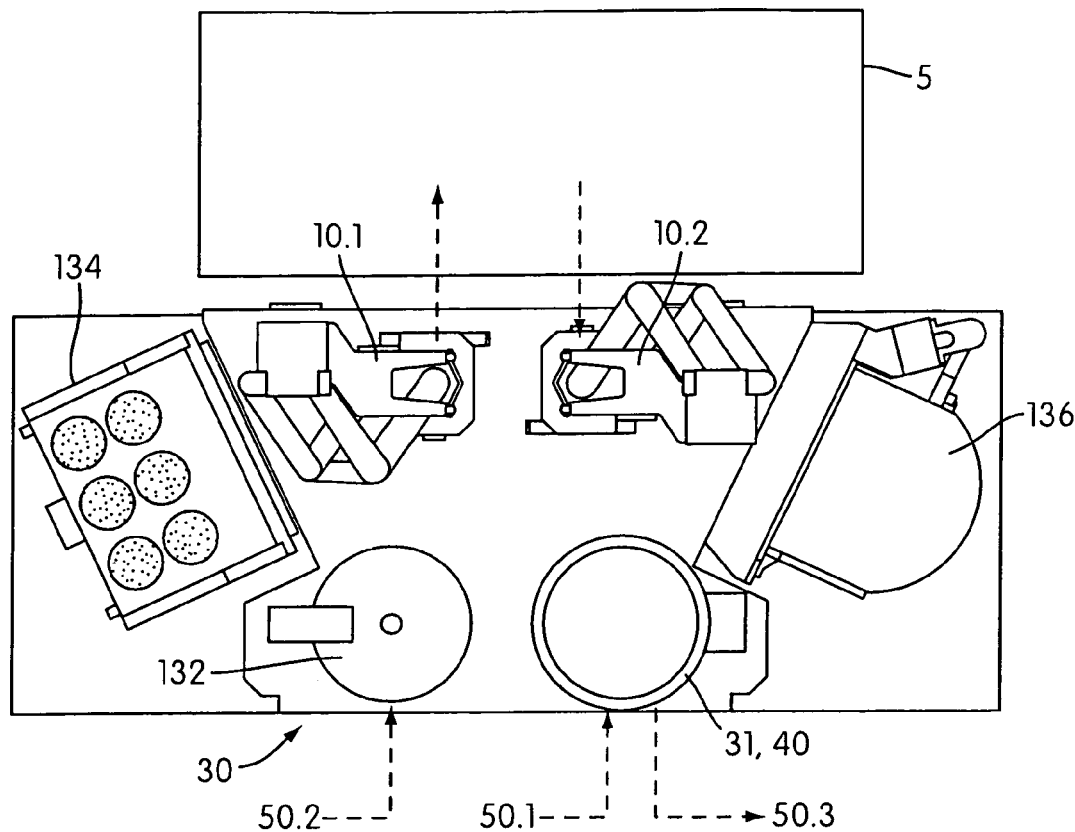
FIG. 7 is a schematic top view of an embodiment of a track interface having a stacked input/output station to be situated between a track and a processing unit of an lithographic apparatus.
Figure 8B:
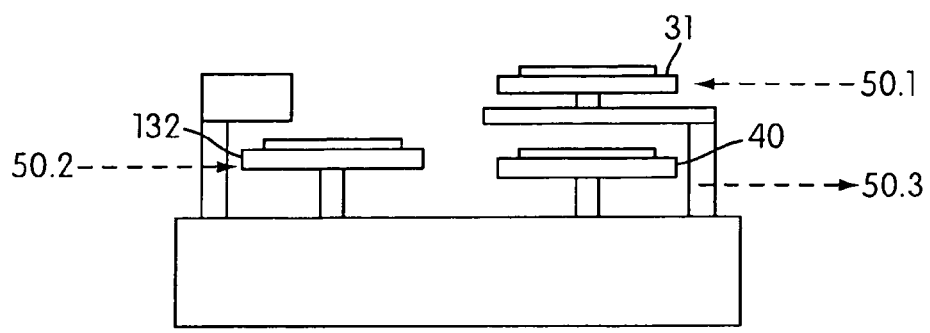
FIGS. 8a-b schematically show side views of the embodiment of FIG. 7.
Figure 8A:
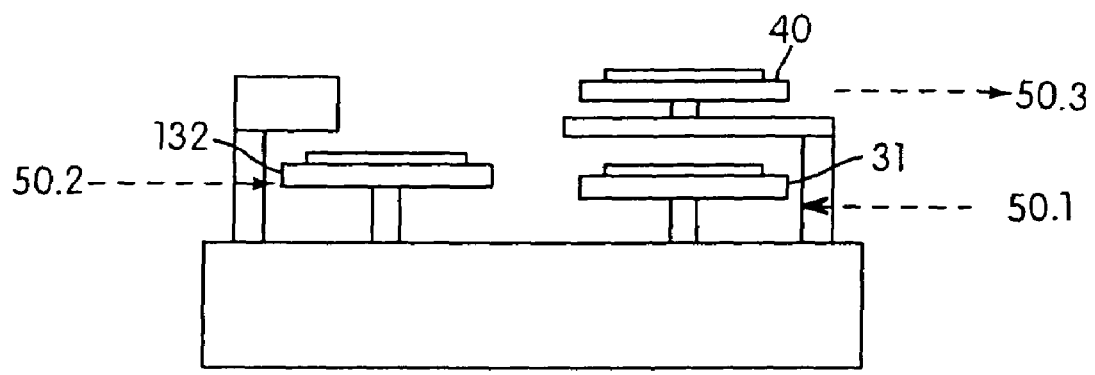

FIG. 7 schematically shows a track interface having a loading station 30 and a transfer unit including a robot 10.1 and a robot 10.2. The track inteíface functions as an interface between the track 50 and the processing unit 5 and is configured as part of a high-productivity substrate handler with a dual input unit, comprising, for example, a substrate receiving unit 31 and a pre-aligner 132. The substrate track receiving unit 31 is stacked vertically (see FIGS. 8a-b) above the substrate track discharge station 40 (see FIG. 8a) or under the substrate track discharge station 40 (vertical stack of inputloutput substrate units in lithographic substrate track interface) (see FIG. 8b). If the track interface is only fed with a track flow 50.1, then the receiving unit 31 serves as a buffer between the substrate track 50 and the pre-aligner station 132 and may take the pre-aligner 132 out of the critical path.

The receiving unit 31 may be equipped with a substrate temperature conditioning function (chill plate or air shower) positioned next to the chill plate of the pre-aligner 132. In this configuration, the substrate can be forced to the required temperature relatively fast which will increase the throughput of the substrate handler. Thus, a substrate track interface with parallel substrate conditioning and pre-alignment capability yielding a relatively high throughput is achieved. Note, however, that it is also possible to feed substrates via an additional track flow 50.2 via the track to the pre-aligner 132 directly, such that a duo input track interface is obtained. The processed substrates flow out via the track according to the track flow 50.3.

The track interface according to FIG. 7 also comprises a control cabinet 134 provided with control software and control equipment for controlling the robots 10.1, 10.2 and for controlling the flow of substrates in the track interface (see, the dotted arrows 50.1, 50.2, 50.3 in FIG. 7 indicating the flow of substrates). In addition, the track interface may be provided with a holder 136 which can serve as an interface between the track interface and a Front Opening Unified Pod (FOUP) for holding/transporting substrates. The FOUP can feed substrates to the track interface via the holder 136. This may be done, for example, if the supply via the track 50.1, 50.2 is hindered.

As already mentioned, it is possible that the track interface has two input units, such as, for example, the receiving unit 31 and the pre-aligner 132. In an advantageous embodiment, the receiving unit 31 is equipped with a pre-alignment function (sensor and rotation unit). In this case the two input units may be used in parallel for substrate input and pre-alignment. Thus, two substrates can be prepared for exposure in the same time, thereby virtually boosting the substrate handler throughput by a factor of two relative to a conventional system having only one input unit.

In another embodiment of the track interface according to FIG. 7, only one single robot 10 is provided instead of two (or more) robots 10.1, 10.2 (for example by removing robot 10.1 and allocating its tasks to robot 10.2). This saves the cost of one robot.

Figure 9:
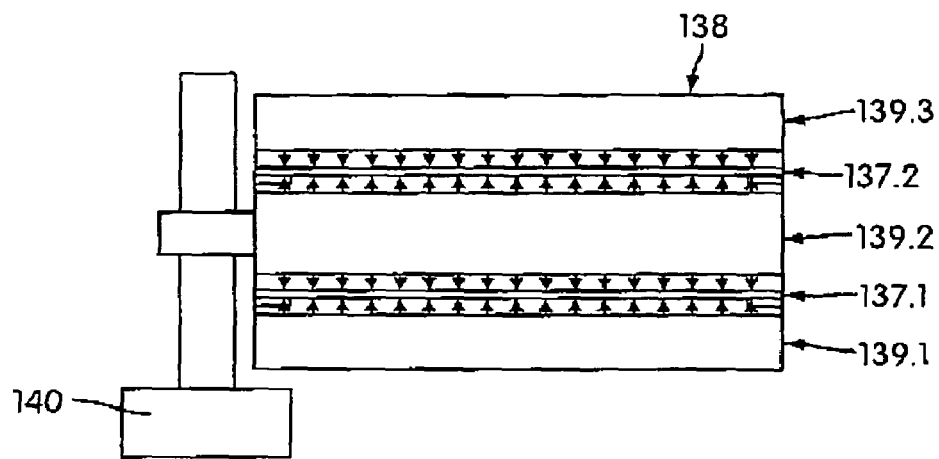
FIG. 9 schematically shows a configuration of a substrate buffer provided with air showers.

In an embodiment of the track interface, multiple substrate positions 137.1, 137.2 are stacked vertically. The stacked substrate positions form a substrate-buffer 138. The substrate-buffer 138 can be provided with air showers 139.1, 139.2, 139.3 (see FIG. 9) for temperature control of the substrates in the substrate-buffer. In the example of FIG. 9 the substrates placed in the respective substrate positions are sandwiched between the air showers. In this way the temperature control of the substrates placed in the substrate-buffer can be performed according to pre-determined specifications relating to suitable temperatures for substrates to be processed in the processing unit 5. The substrate-buffer 138 can be moved in a vertical direction (the Z-direction) by means of the Z-stroke motor 140. The Z-stroke motor can position the substrate-buffer 138 on a pre-determined height such that the robots 10.1 and/or 10.2 can pick a pre-selected substrate relatively easily and quickly from the associated substrate position which is lifted to an appropriate height. Herewith a relatively high throughput is obtained.

The configuration of FIG. 9 yields reduced floor space of the associated substrate handler.

In the track interface (for example according to FIG. 7) air showers may be positioned both at the pre-aligner 132, and at the substrate receive unit 31.

The gas flow on the substrate is preferably substantially perpendicular to the substrate surface for an optimal cooling capacity. For example, in case of a perpendicular gas/air flow, the substrate cooling time is about one substrate cycle time (a cycle time roughly equals the time needed for processing a substrate in the processing unit 5). When the gas flow is parallel to the substrate surface, the heat exchange coefficient is lower, such that about ten substrate cycle times are required to stabilize substrate temperature.

An embodiment of a track interface has a vertical stack of gas/air showers. The stack is provided with a first substrate position and a second substrate position for buffering and substrate cooling. A substrate may be cooled from two sides by an air flow from the air showers. This allows the substrate to stay during a cycle time in the same position as where the track has delivered the substrate, hence reducing the work load of the robot 10. Each substrate position may be used for substrate buffering in one cycle, and for substrate cooling in the next cycle.

Figure 10:
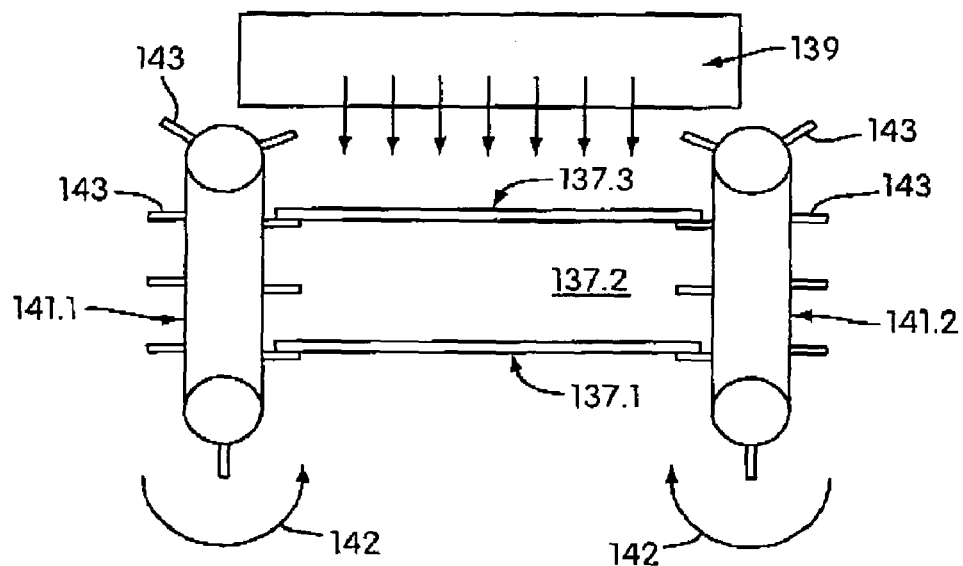
FIG. 10 schematically shows a configuration of a substrate buffer provided with belts for carrying substrates and an air shower located above the belts.

An embodiment of a track interface which requires less substrate cooling than the track interface described in the preceding paragraph may be provided with an air shower for only cooling a single side of the substrate in a substrate position. A further elaboration of this embodiment is given in FIG. 10 which shows a design of vertically stacked substrate (buffer) positions 137.1, 137.2, 137.3 and a fixed air shower 139. The stack is formed by belts 141.1, 141.2 which can be rotated according to the arrows 142. The belts are provided with protrusions (or notches) 143. The protrusions (or notches) of the belts define substrate buffer positions 137.1, 137.2, 137.3 between the belts 141.1, 141.2. Only the top substrate positioned in the substrate position 137.3 is temperature conditioned. After the top substrate is removed (to the substrate stage), the belts 141.1, 141.2 are rotated such that the track can deliver a new substrate on a new created lower substrate position (for example position 137.1). Since the belts rotate and move new substrates to the substrate cooling position 137.3 the air shower 139 can stay in a fixed position.

While specific embodiments of the invention have been described above, it will be appreciated that the invention may be practiced otherwise than as described. As such, the description is not intended to limit the invention. The configuration, operation, and behavior of the present invention has been described with the understanding that modifications and variations of the embodiments are possible, given the level of detail present herein. Thus, the preceding detailed description is not meant or intended to, in any way, limit the invention—rather the scope of the invention is defined by the appended claims.

What is claimed is:

1. A lithographic apparatus, comprising:
   (a) a processing unit configured to process a substrate, the processing unit comprising:
      an illumination system that provides a beam of radiation;
      a support structure configured to support a patterning device that imparts a desired pattern to the beam of radiation;
      a substrate holder configured to hold the substrate;
      a projection system configured to project the patterned beam onto a target portion of the substrate; and
   (b) a track interface arranged adjacent the processing unit in which the patterned beam is projected onto the target portion of the substrate, the track interface having a loading station configured to hold more than one substrate to be processed by the processing unit and a discharge station configured to hold a substrate processed by the processing unit;
   (c) a transfer unit arranged in the track interface and comprising more than one robot configured to directly transfer the substrate to be processed from the loading station to the processing unit and to directly transfer the substrate processed from the processing unit to the discharge station.

2. The lithographic apparatus of claim 1, further comprising a receiving unit that receives the substrate to be processed from a track configured to move objects between different processing stations of a production line.

3. The lithographic apparatus of claim 2, wherein the receiving unit is positioned below the discharge station.

4. The lithographic apparatus of claim 2, wherein the receiving unit includes a temperature conditioner to adjust the temperature of the substrate.

5. The lithographic apparatus of claim 1, wherein the discharge station is configured to supply the processed substrate to a track configured to move objects between different processing stations of a production line.

6. The lithographic apparatus of claim 1, wherein the loading station comprises a pre-alignment unit that determines at least one dimension and a position of the substrates to be processed and loaded into the processing unit.

7. The lithographic apparatus of claim 1, wherein the track interface further comprises a controller that controls at least one of the robots and the substrate flow.

8. The lithographic apparatus of claim 1, wherein the track interface further comprises a holder that serves to feed substrates to the track interface.

9. The lithographic apparatus of claim 1, wherein the track interface is configured with more than one input unit.

10. The lithographic apparatus of claim 9, wherein one input supplies substrates to a pre-aligner station and another input supplies substrates to a receiving unit.

11. The lithographic apparatus of claim 1, wherein the track interface is configured with a plurality of substrate positions that are stacked vertically to form a substrate buffer.

12. The lithographic apparatus of claim 11, wherein the substrate positions of the substrate buffer are located between air showers.

13. The lithographic apparatus of claim 11, wherein the substrate buffer is configured to move along the vertical direction via a motor or actuator.

14. The lithographic apparatus of claim 11, wherein the substrate buffer is configured with a single air shower and a rotatable belt assembly with protrusions or notches that define the substrate positions of the substrate buffer.

15. The lithographic apparatus of claim 1, wherein the track interface is positioned between the processing unit and a track so as to be in direct communication with both the processing unit and the track, the track configured to convey objects between different processing stations of a production line.

* * * * *